United States Patent [19]

Beall et al.

[11] 4,396,971
[45] * Aug. 2, 1983

[54] LSI CHIP PACKAGE AND METHOD

[75] Inventors: Robert J. Beall, San Jose; John J. Zasio, Sunnyvale, both of Calif.

[73] Assignee: Amdahl Corporation, Sunnyvale, Calif.

[*] Notice: The portion of the term of this patent subsequent to Sep. 19, 1995, has been disclaimed.

[21] Appl. No.: 846,698

[22] Filed: Oct. 31, 1977

Related U.S. Application Data

[63] Continuation of Ser. No. 437,164, Jan. 28, 1974, abandoned, which is a continuation-in-part of Ser. No. 270,448, Jul. 10, 1972, abandoned.

[51] Int. Cl.$^3$ .............................................. H05K 7/20
[52] U.S. Cl. ...................................... 361/388; 357/81
[58] Field of Search ............... 174/DIG. 3, 685, 52 S, 174/52 FP; 317/100; 357/74, 80, 81; 361/388

[56] References Cited

U.S. PATENT DOCUMENTS

| | | | |
|---|---|---|---|
| 3,277,957 | 10/1966 | New et al. ............................. | 357/81 |
| 3,405,323 | 10/1968 | Surty et al. ........................ | 317/100 |
| 3,495,023 | 2/1970 | Hessinger et al. ............ | 174/DIG. 3 |
| 3,601,522 | 6/1970 | Lynch ................................. | 174/685 |
| 3,617,817 | 11/1971 | Kawakutsu et al. .................. | 357/80 |
| 3,634,600 | 1/1972 | Griffin ............................... | 174/52 S |
| 3,651,434 | 3/1972 | McGeogh ............................. | 357/74 |
| 3,748,544 | 7/1973 | Noren ...................................... | 174/ |

OTHER PUBLICATIONS

Carroll et al., "Single Chip Carrie Package" *IBM Tech. Disc. Bull.*, vol. 12, No. 4, Sep. 1969, p. 538.

*Primary Examiner*—David Smith, Jr.
*Attorney, Agent, or Firm*—Fliesler, Dubb, Meyer & Lovejoy

[57] ABSTRACT

Package for an LSI chip having a plurality of contact pads comprising a carrier and a cover. The carrier is formed of a base of an insulating material and has a generally planar area for receiving the chip. A cooling stud is mounted on the base and can be provided with one or more removable cooling fins. The stud is mounted on the base opposite the area for receiving the chip. Spaced leads are carried by the base and have outer extremities which extend beyond the base in a direction away from the chip and are free of the carrier and have inner extremities which are in close proximity to the area for receiving the chip. A grounding bus is carried by the carrier to facilitate electrical checking of the package.

18 Claims, 21 Drawing Figures

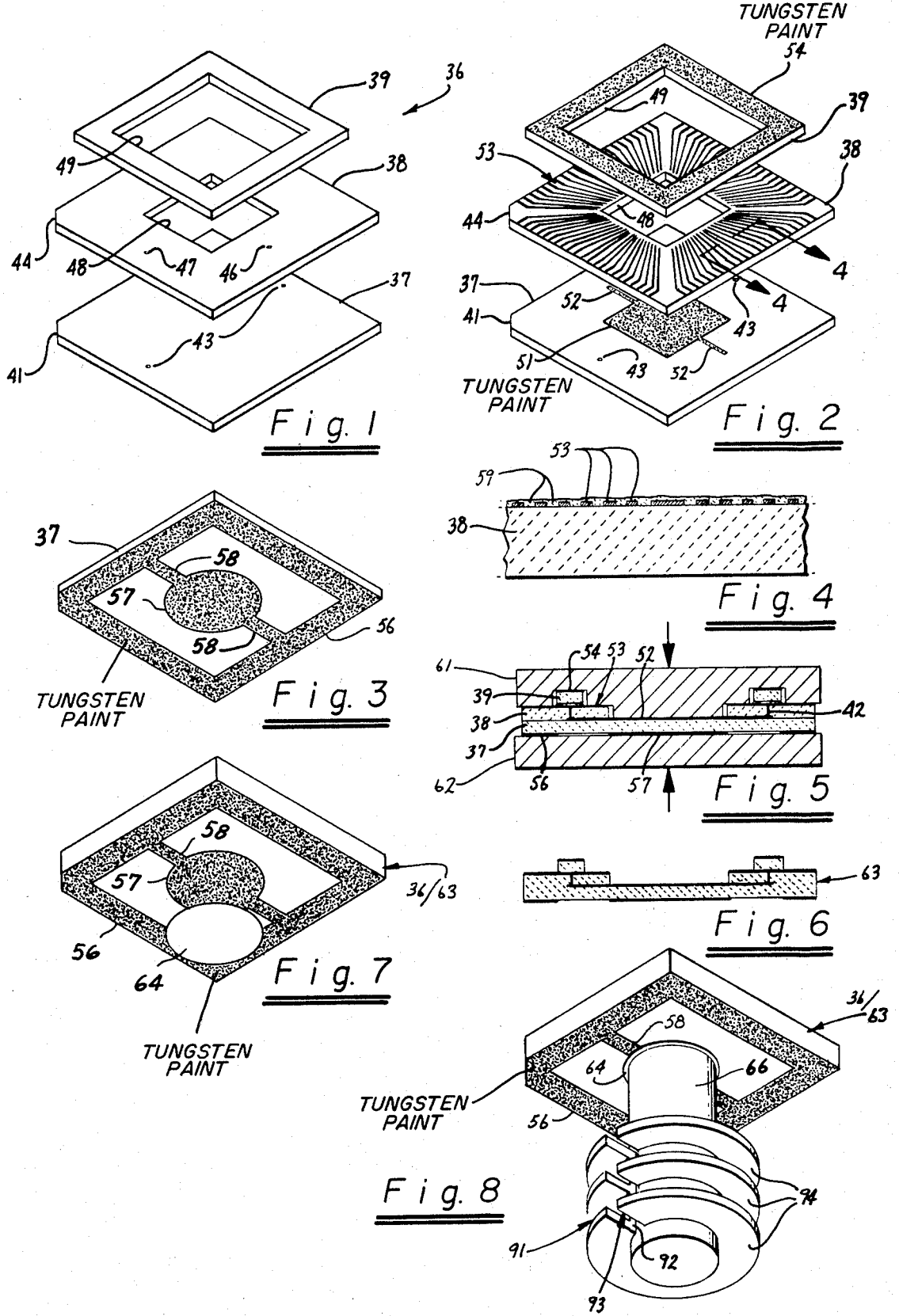

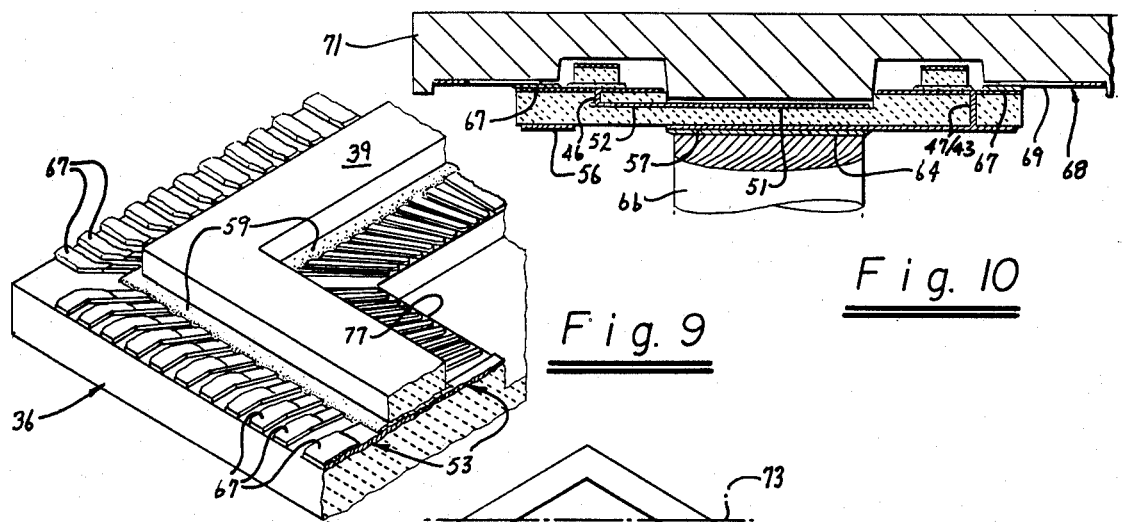
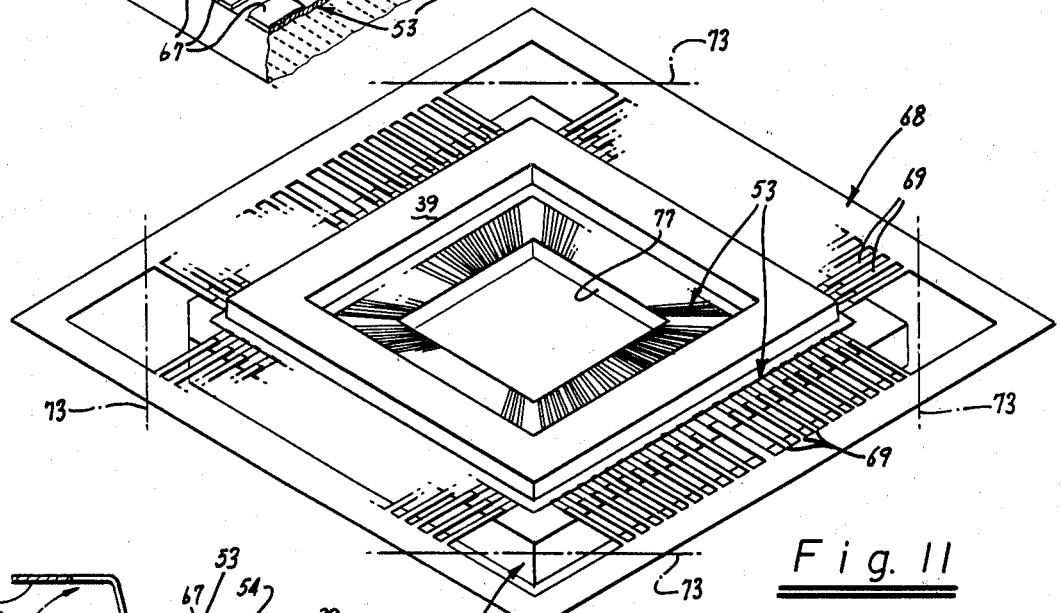
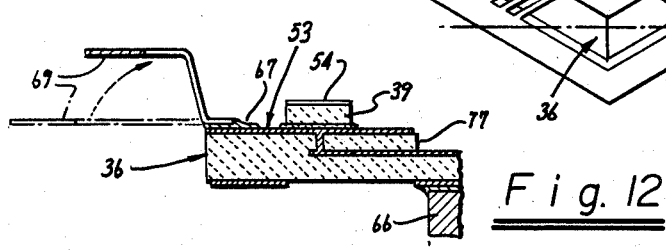
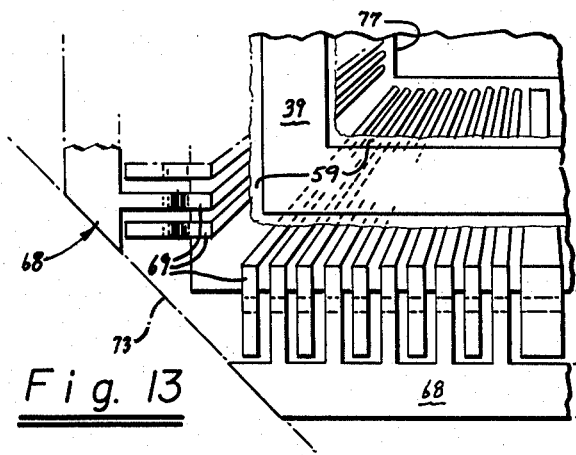
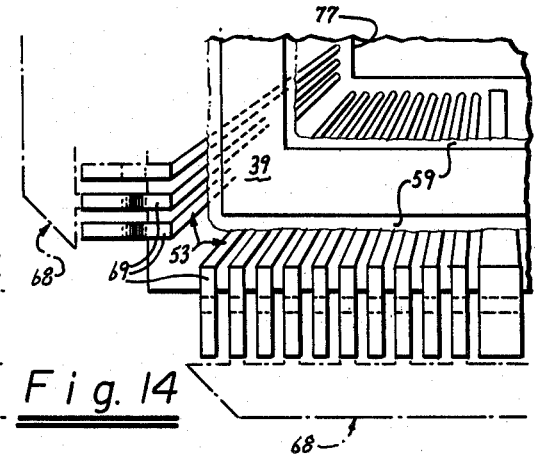

LSI CHIP PACKAGE AND METHOD

CROSS REFERENCE TO RELATED APPLICATION

This application is a continuation of application Ser. No. 437,164, filed Jan. 28, 1974. Application Ser. No. 437,164 was a continuation-in-part of application Ser. No. 270,448, filed July 10, 1972 both abandoned.

BACKGROUND OF THE INVENTION

Packages have heretofore been provided for LSI chips. However, such packages have been unduly complicated and expensive and difficult to mount. In addition, they have inadequate cooling and limited input-output lead capabilities. There is, therefore, a need for a new and improved LSI chip package.

SUMMARY OF THE INVENTION AND OBJECTS

The package is for an LSI chip having a plurality of contact pads to which contact is to be made. The package comprises a carrier which is formed to provide a space for receiving the chip and a cover for hermetically enclosing the space within the carrier. The carrier is formed of a base of an insulating material. A cooling stud is mounted on the base opposite the area where the chip is mounted and forms a part of the carrier. Conducting leads are carried by the base and have outer extremities which extend beyond the base in a direction away from the LSI chip and are free of the carrier and have inner extremities which are carried by the base and which are in close proximity to the space for receiving the LSI chip. An external grounding bus is provided on the base to facilitate checking of the carrier. One or more cooling fins can be mounted on the cooling stud to tailor the package to the power dissipation required by the chip.

In general, it is an object of the present invention to provide an LSI chip package and method which makes it possible to package an LSI chip having a large number of contact pads.

Another object of the invention is to provide a package and method of the above character which facilitates easy checking of the package.

Another object of the invention is to provide a package and method of the above character in which the cooling required for the package can be tailored to the power dissipation required for the chip.

Another object of the invention is to provide a package and method of the above character which is easy to utilize.

Another object of the invention is to provide a package and method of the above character which facilitates efficient heat transfer.

Another object of the invention is to provide a package in which the cooling provided can be readily adjusted.

Another object of the invention is to provide a package in which the leads are positioned so that they can be reflow soldered.

Additional objects and features of the invention will appear from the following description in which the preferred embodiment is set forth in detail in conjunction with the accompanying drawings.

BRIEF DESCRIPTION OF THE DRAWING

FIGS. 1–19 are isometric and cross-sectional views showing the various steps in the manufacture of a package incorporating the present invention.

DESCRIPTION OF THE PREFERRED EMBODIMENT

Figure 15:
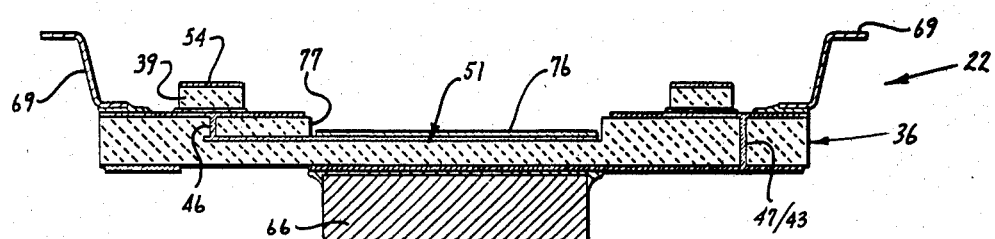
Figure 16:
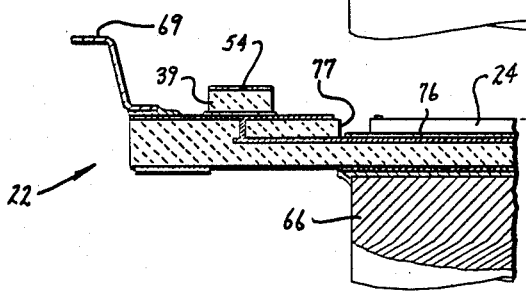
Figure 17:
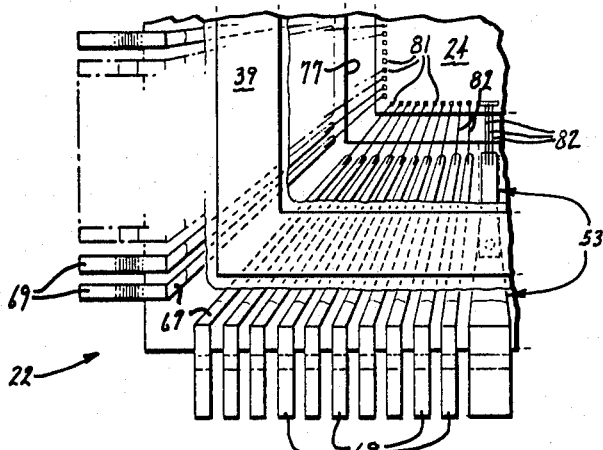
Figure 18:
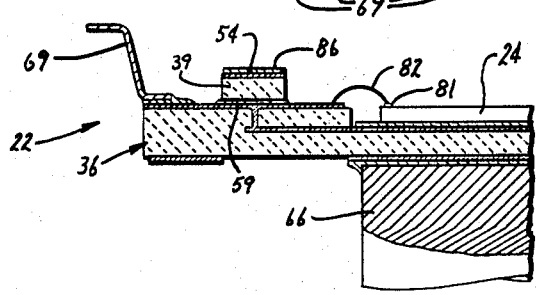
Figure 19:
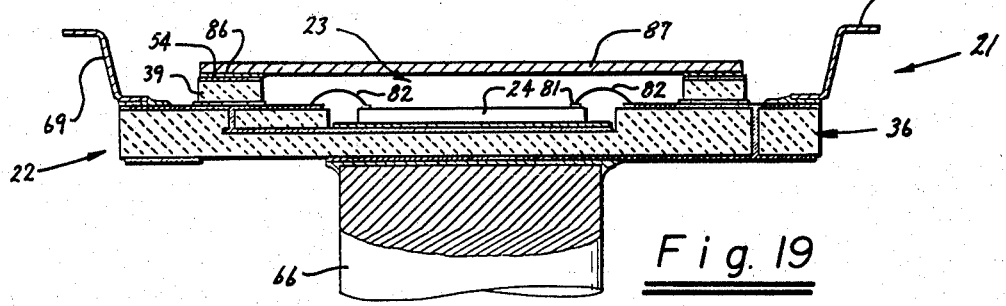

The package 21 comprising the present invention consists of a carrier 22 which has a space 23 therein adapted to receive an LSI chip 24 of the type described in copending application Ser. No. 270,449, filed July 10, 1972 now U.S. Pat. No. 3,808,475. As described therein, the LSI chip is provided with a plurality of transistors and resistors which are interconnected by two layers of metallization that are connected to 76 signal input-output (I/O) pads 26, two large ground pads 27, two large voltage pads 28 and four small ground pads 29 to make a total of 84 pads, with 21 pads on each side of the four-sided chip. The four larger bonding pads are 4×14 mils in size, whereas the smaller pads are 4×4 mils with a 2 mil spacing between pads. A cover 31 is provided for sealing the space 23 containing the LSI chip 24.

The steps for fabricating the carrier 22 are shown in FIGS. 1–19. As shown in FIG. 1, the carrier is formed of a ceramic base 36 which is fabricated from three parts or pieces 37, 38 and 39 of green ceramic of a suitable type such as of 94% alumina. The piece 37 is square as shown in FIG. 1 but, if desired, can have any suitable configuration. One corner 41 is notched or marked for registration purposes. A pair of spaced holes 43 is formed in the green ceramic by suitable means such as a pin. The piece 38 has the same size and configuration as the piece 37 and is also provided with a notched or marked corner 44. Two pairs of spaced holes 46 and 47 are formed in the piece 38 in a suitable manner such as by a pin. The holes 47 are positioned so that they can be placed in registration with the holes 43 provided in the piece 37. An imaginary line extending through the holes 46 extends at right angles to another imaginary line extending through the holes 47. A square opening 48 is formed in the center of the piece 38 and is provided for forming the space 23 for receiving the LSI chip 24. The piece 39 has the same general conformation as pieces 37 and 38 although it is of a smaller size so that it is within the confines of the holes 46 and 47 of the piece 38. It is also provided with a square opening 49 which is of a size which is substantially larger than the opening 48.

After the pieces 37, 38 and 39 have been formed, a metallized paint such as tungsten paint is screened onto the pieces or parts. Thus, as shown in FIG. 2, the tungsten paint is screened onto a die bond area 51 generally in the center of the piece 37 on the top side. This die bond area 51 is generally square as shown in FIG. 2. The tungsten paint also extends over two extensions 52 which extend to meet the holes 46 of piece 38 which are filled with the tungsten paint. The holes 43 are also filled with the tungsten paint.

A lead pattern 53 is screened onto the top side of the part 38. As can be seen, four large leads are provided in the lead pattern 53. These larger leads extend over the holes 46 and 47 provided in the part 38 and, in addition, the tungsten paint fills these holes 46 and 47. The top side of the part 39 is also covered with tungsten paint 54 as shown in FIG. 2. The under side of the part 37 is also provided with a pattern of the tungsten paint which is screened on the part to form the rectangular ground bus 56 extending about the under side of the part 37 adjacent the outer perimeter of the same. There also is provided a circular centrally disposed area 57 which is connected by connecting elements 58 to the bus 56.

After all the screening of the tungsten paint has been completed, a ceramic slurry 59 is screened onto the parts 37, 38 and 39 which fills in the voids between the leads of the lead pattern 53. The three separate parts 37, 38 and 39 are then laminated into a single unitary structure and placed in a press having first and second parts 61 and 62. During the time that pressure is being applied to the parts 61 and 62 to laminate the parts or pieces 37, 38 and 39, the parts 37, 38 and 39 are fired at a suitable temperature as, for example, approximately 1600° C. for approximately one-half hour to provide a unitary structure and in which a hermetic seal is formed between the parts. During the firing at the high temperature, the tungsten is fired into the ceramic material. The ceramic slurry, since it is not organic, is not burned out but fills the voids between the leads and forms a hermetic seal as hereinbefore described. The tungsten paint is utilized in this process because a refractory metal must be provided which is able to withstand the high curing temperature of 1600° C. used for curing the ceramic.

All of the exposed tungsten is next plated with nickel as shown in FIG. 6 so that all tungsten areas have a layer of nickel thereon as shown at 63 in FIG. 6. A circular preform 64 is formed of a suitable material such as silver and copper, although other materials can be utilized. A cylindrical cooling stud 66 of a suitable size such as ½ inch in length and 0.2 inch in diameter is provided. The cooling stud, which is formed of a suitable material such as molybdenum plated with nickel, is brazed to the circular area 57 by the use of the preform 64 to form a silver-copper eutectic.

A lead preform 67 of a suitable material such as silver or a combination of silver and copper is placed on the outer extremities of the lead pattern 53 provided on the outer perimeter of the base 36 as shown in FIG. 9. This lead preform 67 is brazed to the lead pattern 53 in a conventional manner. Thereafter, a lead frame 68, which has a generally rectangular configuration and which is provided with a plurality of inwardly extending leads 69 which are elongated and generally parallel to each other as shown in FIG. 11, is positioned so that the inner extremities of the leads 69 overlie the lead preform 67 as shown in FIG. 10. The lead frame 68 is formed of a suitable material such as Kovar. The leads 69 and the lead frames 68 are then brazed to the lead preform 67 in a conventional manner at a temperature of 800°–900° C. with a carbon weight 71 holding the leads 69 in place (see FIG. 10).

Alternatively, if desired, the stud 66 can be brazed to the structure after the lead frame 68 has been brazed to the structure. After the brazing operations have been completed, all of the exposed metal parts of the structure shown in FIG. 10 are electroplated with nickel and thereafter are electroplated with gold.

The corners of the lead frame 68 are then clipped off in the vicinity of the broken lines 73 as shown in FIG. 11. After the corners have been clipped, the structure shown in FIG. 11 is placed in a lead forming jig or tool (not shown) in which the outer extremity of the lead frame including the outer extremity of the leads 69 are bent upwardly so that the leads assume a "Z" shaped configuration with the intermediate portion being inclined in an outward direction as shown in FIG. 12. As soon as the leads have been formed as shown in FIG. 12, every other lead 69 is separated from the lead frame 69 as shown in FIG. 13 and a "go" "no-go" continuity check is made of these particular leads to see if they are all satisfactory. If they are all satisfactory, the carrier is assumed to be ready for use by a device manufacturer.

Now let it be assumed that it is desired to place a chip in the carrier 22. First, a preform 76 formed of a suitable material such as gold is placed in the recess 77 over the die area 51 provided in the carrier 22 (see FIGS. 11 and 15). A die or chip 24 of the type described in copending application Ser. No. 270,449, filed July 10, 1972, now U.S. Pat. No. 3,808,475 or of any other suitable type can then be positioned within the recess 77. As described in said copending application Ser. No. 270,449, filed July 10, 1972, now U.S. Pat. No. 3,808,475 the die or chip 24 is formed of a semiconductor body with the devices in the semiconductor body being formed on one side of the semiconductor body. The other side of the semiconductor body is placed on the gold preform 76. The carrier 22 is heated to a suitable temperature as, for example, 450° C. Since the carrier is heated to approximately 450° C., an insertion of the preform and the die or chip 24 into the recess 77 will cause a silicon-gold eutectic to form at this temperature to bond the back side of the semiconductor body to the preform 76 and to the die bond area 51 carried by the base 36 (see FIG. 16).

As described in said copending application Ser. No. 270,449, filed July 10, 1972, now U.S. Pat. No. 3,808,475 the die or chip 24 is provided with a plurality of pads 81 adjacent the outer perimeter of the same which are connected to the devices in the die or chip. Leads 82 of a suitable material such as gold wire are thermocompression bonded to the pads 81 and to the inner extremities of the lead pattern 53 as shown particularly in FIG. 17. As can be seen from FIG. 17, certain of the pads 81 and certain of the leads in the lead pattern 53 are larger. A plurality of wires 82 as, for example, three, serve to form a connection between such pads and leads. In this way, it can be seen that connections are made from the leads 69 extending to the outside world to the devices carried by the die or chip 24.

After the wire bonding has been completed, a preform 86 of a suitable material such as solder is placed on top of the base 36 and has generally the same configuration as the top surface of the part 39 which formed a part of the base. A lid or cover 87 formed of a suitable material such as gold-plated Kovar is placed over the solder preform 86 and then the entire assembly is sealed in a furnace at a suitable temperature as, for example, 400°–500° C. This temperature does not affect the bond formed between the die 24 and the base 36 because the silicon-gold eutectic will not be affected except at a temperature substantially higher than the eutectic temperature of 450° C. After the sealing operation has been completed, tests are made to ascertain whether a good hermetic seal has been obtained. The leads 69 can be sheared to their proper lengths. In the event that the lead frame is left in place and is not separated from the leads prior to this time, the lead frame can be separated. The other extremities of the leads 69 can then be coated with solder so that the entire package 21 is ready for use.

Figure 20:
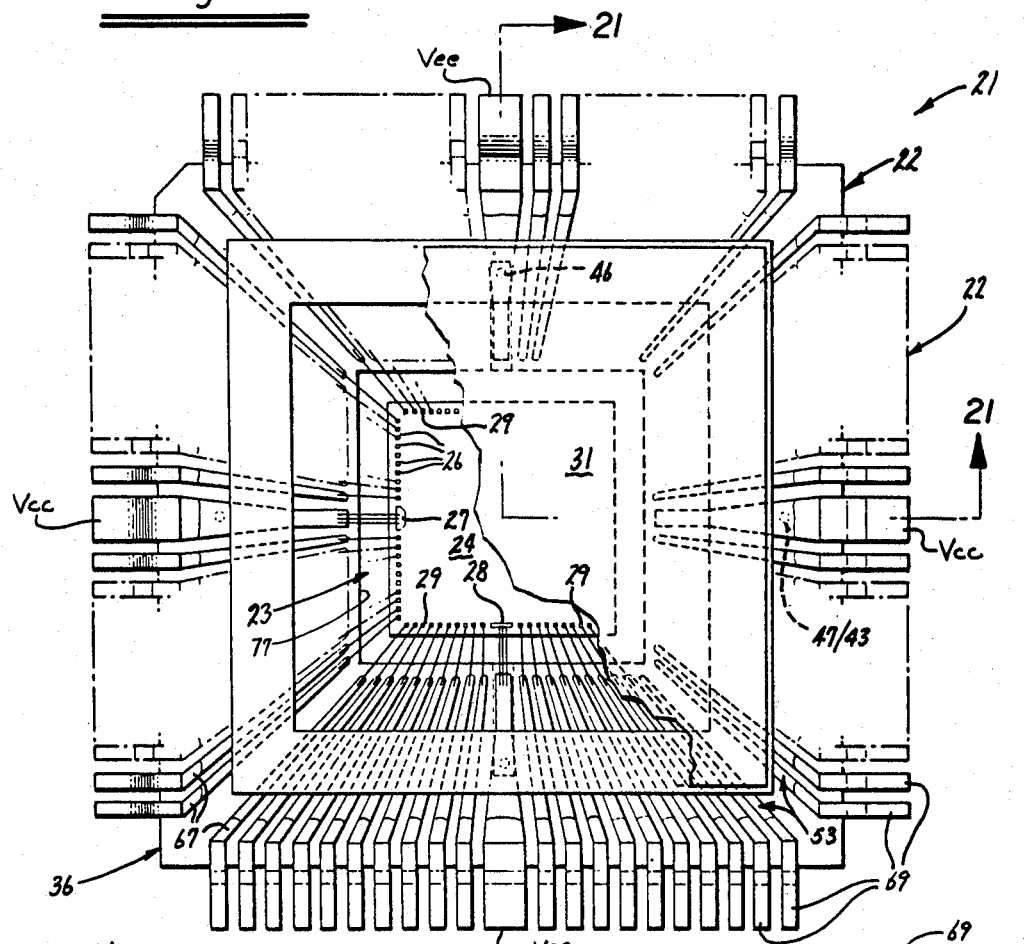
FIG. 20 is a top plan view with portions broken away showing a package incorporating the present invention.
Figure 21:
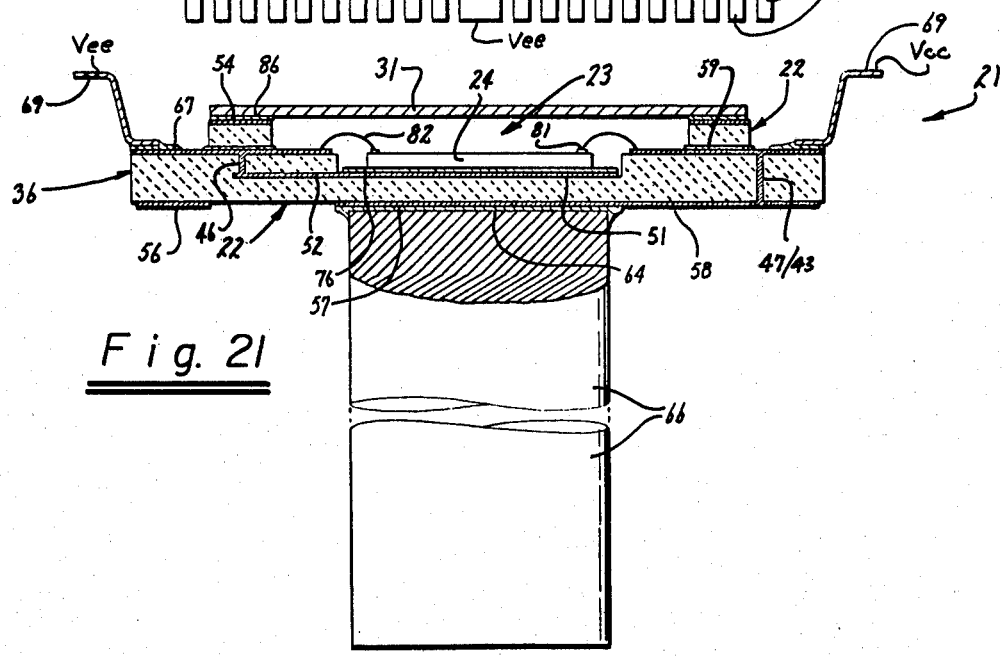
FIG. 21 is a cross-sectional view taken along the line 21—21 of FIG. 20.

The completed device is shown in FIGS. 20 and 21. The package shown in FIGS. 20 and 21 is of a type particularly adapted for use with the LSI chip which is shown and described in copending application Ser. No. 270,449, filed July 10, 1972 now U.S. Pat. No. 3,808,475. It is provided with 84 leads with 21 leads on each side with one of the leads on each side being substantially larger than the other leads. Two of these large leads are identified with the designation $V_{ee}$ which are utilized for supplying the voltage to the package. The other two leads on the other two sides are identified with the designation $V_{cc}$ and are utilized for connecting the device to ground.

From FIG. 21, it can be seen that during the formation of the base that the material which was forced into the holes 42, 43, 46 and 47 serves to form electrical connections.

It has been found that packages constructed in accordance with the foregoing method are able to readily withstand certain physical and environmental test requirements. For example, the leads 69 are capable of withstanding two cycles of bending such that under 10 times magnification, there is no evidence of breakage, loosening or relative motion between the terminal lead and the device body. A cycle of bending of the lead is from its normal position through a 90° angle away from the carrier and then back to its normal position. The lead brazing was capable of withstanding a lateral pull sufficient to break the Kovar lead.

With respect to high temperature aging, the package was able to withstand an exposure to 150° C. air for 72 hours or 450° C. for 2 minutes and not cause discoloration of any gold plating on the package.

With respect to temperature cycling, the package was capable of withstanding 10 cycles of temperature cycling per mil-std-883 method 1010, condition C.

The packages were capable of being sealed hermetically to $5 \times 10^{-7}$ atoms/sec. The package was capable of withstanding exposure to boiling water for 5 minutes without evidence of destructive corrosion.

The lead resistance of the large power leads was $75 \pm 15$ mohms measured from the lower lead bin to the wire bond area and the lead resistance of the small leads was less than 250 mohms.

The ground bus 56 about the bottom exterior of the device facilitates checking of the devices in the package with a coaxial probe. The close proximity of the leads to the ground bus makes it possible to use very short conductors on the probe to thereby make measurements of fast circuits.

In many applications of the package, it has been found that the stud 66 in and of itself provides sufficient and adequate cooling for an LSI chip. However, in the event that chips of different types are mounted in the package and the chips have different power dissipation requirements, the cooling for the individual package can be tailored to meet the power dissipation requirements of the chip mounted therein so that the temperature rise for any one of the chips mounted in the package is limited to a rise from an ambient of approximately 20°–32° C. to a maximum temperature of 80° C. This can be accomplished by the use of a cooling fin assembly 91 of the type shown in FIG. 8. As shown therein, the cooling fin assembly consists of a split cylindrical sleeve 92 which is provided with a slit 93 extending longitudinally of the same. Formed integral with the sleeve 92 are a plurality of circular discs or fins 94 which extend outwardly radially from the sleeve 92 and which are spaced apart and lie in generally parallel planes. As can be seen from FIG. 8, three of such fins 94 have been provided but, if desired, a fewer or greater number of such fins can be provided to obtain the desired cooling. The cooling fin assembly 91 can be formed of a suitable material such as copper which has been nickel plated and then gold plated in a conventional manner such as by electroplating. The gold is utilized to make good heat contact with the gold plating on the stud 66. Since the cooling fin assembly is provided with a split, it can be readily removed and inserted on the stud 66 because of the slip fit. By applying the cooling fin assembly 91 to the stud 66, it can be seen that the cooling capabilities of the stud are greatly enhanced because of the heat dissipation capabilities of the fins 94 provided as a part of the cooling fin assembly. By utilizing a cooling fin assembly of the desired number of fins, it can be seen that the cooling capabilities of the stud 66 can be tailored to meet the power dissipation requirements of the chip mounted within the package to limit the temperature rise as hereinbefore described.

From the construction shown, it can be seen that the LSI chip 24 is mounted on carrier 22 in a region which is immediately opposite the region on which the stud 66 is mounted so that there can be a relatively direct transfer of heat from die to the cooling stud. The leads 69 are brazed onto the base 36 in such a manner that they extend upwardly and outwardly away from the base and up and beyond the cover 31. This is particularly desirable since it permits the ends of the leads 69 to be dipped into a solder bath so that the leads can be reflow soldered and mounted on printed circuit boards and the like when used.

It is apparent from the foregoing that there has been provided a package which is particularly adaptable for packaging LSI chips and which makes it possible to tailor the cooling characteristics of the package so that it corresponds with the power dissipation requirements of the chip mounted within the package. The package is of a flat-pack type having high density leads. The package is provided with a ground bus on the perimeter of the package surface making electrical testing of the package very easy by the use of a coaxial type probe in which it is desirable that the two conductors of the coaxial probe contact the package at closely spaced points so that very fast signals can be measured. The package construction is such that it meets all conventional physical and environmental tests which should be met by such packages. The package is also one which can be manufactured relatively economically considering its complexity.

We claim:

1. In an aircooled package for an LSI chip having a plurality of contact pads around its outer perimeter, a carrier having a base formed of an insulating material, said carrier having a relatively planar surface for receiving the chip, said carrier comprising a unitary ceramic body which is free of glass seals, a cooling stud secured to the base on the side of said base generally opposite the planar surface provided for said chip for exposure to the atmosphere for cooling by air, a conductive lead pattern formed on the carrier having portions adapted to be connected to the chip, and a plurality of relatively rigid conductive leads mounted on said carrier and in contact with said lead pattern, said conductive leads extending outwardly from said base and having contact areas lying in a plane generally parallel to the planar surface and facing in a direction away from the base opposite the direction in which the cooling stud faces from the base.

2. A package as in claim 1 wherein said base is provided with a space overlying said planar surface for receiving said chip, together with cover means secured to said base and hermetically enclosing said space.

3. A package as in claim 2 wherein said leads extend outwardly away from said base and extend upwardly beyond said cover means.

4. A package as in claim 1 wherein said lead pattern extends inwardly into a region in close proximity to said planar surface.

5. A package as in claim 4 wherein said leads are brazed to said pattern.

6. A package as in claim 1 together with a grounding bus provided on the side of said base to which the cooling stud is secured and near the outer perimeter of the base.

7. A package as in claim 1 together with a cooling fin assembly mounted on said cooling stud.

8. A package as in claim 7 wherein said cooling fin assembly is readily removable.

9. A package as in claim 8 wherein said cooling fin assembly includes a plurality of spaced generally circular fins and means for securing said fins to said cooling stud.

10. A package as in claim 9 wherein said means for securing said fins to said cooling stud includes a split sleeve.

11. A package as in claim 1 wherein said leads include at least one large lead and a plurality of small leads on each side of the package.

12. In a package for use with a chip of the type having oppositely facing parallel first and second major chip surfaces and a plurality of spaced apart contact pads disposed adjacent the outer perimeter on said first major chip surface, said package having a base with oppositely facing parallel first and second major base surfaces, wall means defining a recess extending downwardly through said first major base surface for receiving the chip, a chip carrying surface in said recess parallel to the first major base surface and inset from the first major base surface, means securing the chip to said chip carrying surface so that said second chip surface is in contact with said chip carrying surface and said first chip surface is in close proximity to said first major base surface, a lead pattern formed on said first major base surface extending into close proximity to said recess whereby said lead pattern and said pads on a chip in said recess each have exposed surfaces facing in the same direction into a region extending from said chip carrying surface and said first major base surface outwardly in a direction away from said base thereby permitting access through said region to connect leads between said exposed surfaces of said pads and said lead pattern, and a cooling stud secured to said second major base surface generally opposite said chip carrying surface and extending away from said second major base surface outwardly in a direction away from said base for exposure to the atmosphere for cooling by air.

13. A package as in claim 12 wherein said base is formed exclusively of a ceramic which is essentially all alumina and said package is free of glass seals.

14. A package as in claim 13 wherein said lead pattern extends on said first major base surface to all four sides of said base, and including a plurality of relatively rigid conductive leads mounted on said first major base surface near the outer perimeter of said base in contact with said lead pattern, said conductive leads extending outwardly from all four sides of said rectangular base and having contact areas lying in a plane generally parallel to said first major base surface, said contact areas facing in a direction away from the base and opposite the direction in which the cooling stud extends from said base.

15. A package as in claim 14 including a raised part carried on said first major base surface surrounding said recess and being spaced inwardly from the other perimeter of said base, and wherein said lead pattern extends below said raised part.

16. A package as in claim 15 together with cover means attached to said raised part and overlying said recess for enclosing said chip and said leads between said exposed surfaces of said pads and said lead pattern.

17. In a package for use with an LSI chip of the type having oppositely facing parallel first and second major chip surfaces and a plurality of spaced apart contact pads disposed adjacent the outer perimeter on said first major chip surface, said package including a one-piece carrier formed exclusively of a ceramic which is essentially all alumina, said carrier being free of glass seals and having a base with oppositely facing parallel first and second major base surfaces, having wall means defining a recess extending downwardly through said first major base surface for receiving the chip, a chip carrying surface in said recess parallel to the first major base surface and inset from the first major base surface, means securing the chip to said chip carrying surface so that the second chip surface is in contact with the chip carrying surface and the first chip surface is in close proximity to the first major base surface, a raised part carried on said first major base surface surrounding said recess and being spaced inwardly from the outer perimeter of the base, a metallic cooling stud secured to said second major base surface generally opposite said chip carrying surface and extending away from said second major base surface outwardly in a direction away from said base for exposure to the atmosphere for cooling by air, a lead pattern formed on said first major base surface extending below said raised part and into close proximity to said recess whereby said lead pattern and said pads on a chip in said recess each have exposed surfaces facing in the same direction into a region extending from said chip carrying surface and said first chip surface outwardly in a direction away from said carrier thereby permitting access through said region to connect leads between said exposed surfaces of said pads and said lead pattern, said lead pattern extending on said first major base surface to all four sides of said base, and a plurality of relatively rigid conductive leads mounted on said first major base surface near the outer perimeter of said base in contact with said lead pattern, said conductive leads extending outwardly from all four sides of said rectangular base and having contact areas lying in a plane generally parallel to said first major base surface, said contact areas facing in a direction away from the base and opposite the direction in which the cooling stud extends from said base.

18. In a package for use with an LST chip of the type having oppositely facing parallel first and second major chip surfaces and a plurality of spaced apart contact pads disposed adjacent the outer perimeter on said first major chip surface, said package including a one-piece carrier formed exclusively of a ceramic which is essentially all alumina, said carrier being free of glass seals and having a base with oppositely facing parallel first and second major base surfaces, said base having wall means defining a recess extending downwardly through said first major base surface for receiving the chip, a chip carrying surface in said recess parallel to the first major base surface and inset from the first major base surface, means securing the chip to said chip carrying surface so that the second chip surface is in contact with the chip carrying surface and the first chip surface is in close proximity to the first major base surface, a raised part carried on said first major base surface surrounding said recess and being spaced inwardly from the outer perimeter of the base, a metallic cooling stud secured to said second major base surface generally opposite said chip carrying surface and extending away from said second major base surface outwardly in a direction away from said base for exposure to the atmosphere for cooling by air, a lead pattern formed on said first major base surface extending below said raised part and into close proximity to said recess whereby said lead pattern and said pads on a chip in said recess each have exposed surfaces facing in the same direction into a region extending from said chip carrying surface and said first chip surface outwardly in a direction away from said carrier thereby permitting access through said region to connect leads between said exposed surfaces of said pads and said lead pattern, said lead pattern extending on said first major base surface to all four sides of said base, a grounding bus pattern bonded to and formed on said second major base surface adjacent the outer perimeter of said base, conductive means extending through said base connecting said grounding bus pattern to said lead pattern, cover means secured to said raised part and hermetically enclosing said recess, and a plurality of relatively rigid conductive leads mounted on said first major base surface near the outer perimeter of said base in contact with said lead pattern, said conductive leads extending outwardly from all four sides of said rectangular base beyond the perimeter of said base and extending from said first major base surface beyond said cover means and having contact areas lying in a plane generally parallel to said first major base surface, said contact areas facing in a direction away from the base and opposite the direction in which the cooling stud extends from said base, and a removable cooling fin assembly mounted by a slip fit on said cooling stud.

* * * * *